(12) United States Patent
Nishi

(10) Patent No.: US 7,052,806 B2
(45) Date of Patent: May 30, 2006

(54) EXPOSURE CONTROLLING PHOTOMASK AND PRODUCTION METHOD THEREFOR

(76) Inventor: Takashi Nishi, 8-14 Takezono 1-chome Room 213, Bldg. 906, Tsukuba-shi, Ibaraki, 305-0032 (JP)

( * ) Notice: Subject to any disclaimer, the term of this patent is extended or adjusted under 35 U.S.C. 154(b) by 92 days.

(21) Appl. No.: 10/220,973

(22) PCT Filed: Mar. 14, 2001

(86) PCT No.: PCT/JP01/02006

§ 371 (c)(1),
(2), (4) Date: Nov. 13, 2002

(87) PCT Pub. No.: WO01/69316

PCT Pub. Date: Sep. 20, 2001

(65) Prior Publication Data

US 2003/0135979 A1    Jul. 24, 2003

(30) Foreign Application Priority Data

Mar. 14, 2000  (JP) .............................. 2000-117245
Mar. 27, 2000  (JP) .............................. 2000-131832

(51) Int. Cl.
*G03F 9/00* (2006.01)
*G03C 5/00* (2006.01)

(52) U.S. Cl. .......................... 430/5; 430/296; 430/314; 430/320; 430/321; 430/942

(58) Field of Classification Search .................... 430/5, 430/321, 320, 296, 314, 942
See application file for complete search history.

(56) References Cited

U.S. PATENT DOCUMENTS 4,971,426 A    11/1990  Schildkraut et al.
5,620,814 A *   4/1997  Kley ............................. 430/5
5,853,921 A    12/1998  Moon et al.
6,335,151 B1 *  1/2002  Ausschnitt et al. ......... 430/322
6,534,221 B1 *  3/2003  Lee et al. ....................... 430/5

FOREIGN PATENT DOCUMENTS

| CN | 362168 | 6/1999 |
|----|--------|--------|
| JP | 57-94706 | 6/1982 |
| JP | 64-20628 | 1/1989 |
| JP | 3-132727 | 6/1991 |
| JP | 5-14725 | 1/1993 |
| JP | 5-142752 | 6/1993 |
| JP | 6-27636 | 2/1994 |
| JP | 7-211614 | 8/1995 |
| JP | 9-7115 | 1/1997 |
| JP | 11-237625 | 8/1999 |

* cited by examiner

*Primary Examiner*—Christopher G. Young
(74) *Attorney, Agent, or Firm*—Jordan and Hamburg LLP

(57) ABSTRACT

The present invention relates to an exposure controlling photomask used to form a three-dimensional face structure in a resist pattern and having a light interrupting film able to be continuously controlled in transmitted light amount from 100% to 0%, and a production method thereof. A light interrupting film 2 is deposited on a substrate 3, and a photosensitive material 6 is coated on this light interrupting film 2. Next, irradiation is performed by changing the irradiating amount of an electron beam every place of the photosensitive material 6 using an electron beam exposure technique. Next, development is performed and the photosensitive material is formed in the three-dimensional face structure. Next, in an etching process, the three-dimensional face structure is transferred to the light interrupting film 2 by etching-back the photosensitive material 6 and the light interrupting film 2 as a foundation.

14 Claims, 10 Drawing Sheets

EXPOSURE CONTROLLING PHOTOMASK AND PRODUCTION METHOD THEREFOR

TECHNICAL FIELD

The present invention relates to an exposure controlling photomask and a production method therefor used in the manufacture of a three-dimensional face structural body such as a micro lens, a micro machine, a micro gear, an optical integrated circuit, a reflection type liquid crystal display device, a micro coil, etc.

BACKGROUND ART

There is conventionally a photolithography technique in a technique for forming the three-dimensional face structural body such as a micro coil described in e.g., Japanese Patent No. 3132727. An exposure controlling photomask able to continuously control the light amount of transmitted light is used in this photolithography technique. There are the following photomasks in the exposure controlling photomask.

A first exposure controlling photomask is a mask for controlling the light amount of the transmitted light by laminating a light interrupting film described in the prior art of Japanese Patent Laid-Open Nos. 27636/1994 and 237625/1999 as shown in FIG. 13 in a stepwise shape. A second exposure controlling photomask is a mask for controlling the light amount of the transmitted light by adjusting the numerical aperture of a light interrupting area by a dot pattern (or hole) selectively drawn in a light interrupting film described in Japanese Patent Laid-Open Nos. 7115/1997 and 14725/1993 as shown in FIG. 14. In a third exposure controlling photomask, a transfer die having a die face having a convexo-concave portion of a curved surface shape is prepared as reported in Japanese Patent Laid-Open No. 237625/1999, and is pressed against a resin layer for adjusting the light transmitting amount on a mask substrate. The convexo-concave portion of the curved surface shape is transferred and formed on this resin layer, and this resin layer is next hardened by irradiating an ultraviolet ray, etc. The third exposure controlling photomask is a mask for controlling the light amount of the transmitted light by the film thickness of the convexo-concave portion of the curved surface shape in the resin layer formed in this way.

However, the first exposure controlling photomask has the stepwise shape with respect to the shape of the convexo-concave portion on the surface. Accordingly, when this exposure controlling photomask is manufactured, stepped portions of the convexo-concave portion are formed every one step. Therefore, it is necessary to repeatedly perform the photolithography for coating, exposing and developing photosensitive resin so that cost is raised. Further, since the convexo-concave portion on the surface has the stepwise shape, the photosensitive resin on the substrate intended to be transferred in this state as it is also becomes a convexo-concave portion of the stepwise shape. An overcoat layer must be formed by coating and burning an overcoat agent on the surface of the photosensitive resin to form the convexo-concave portion of the curved surface shape. However, it was difficult to control the photosensitive resin layer in the shape of the convexo-concave portion of the curved surface shape in the coating and burning processes.

In the second exposure controlling photomask, the light amount of the transmitted light depends on the size of the dot pattern (or hole). Therefore, it was difficult to control the size of the photosensitive resin in its transversal direction and the film thickness.

The third exposure controlling photomask has the convexo-concave portion of the curved surface shape smooth in comparison with the first and second exposure controlling photomasks so that the smooth convexo-concave portion of the curved surface shape can be also transferred to a photosensitive material.

In accordance with Japanese Patent Laid-Open No. 237625/1999, the pitch between top portions of a convex portion is about 1 to 100 times, preferably about 25 times the height of the convexo-concave portion of the curved surface shape. For example, when the height of the convexo-concave portion of the curved surface shape is 1.2 microns, the pitch between the top portions of the convex portion is written as about 30 microns. In the method for transferring the die by mechanical pressing, it is difficult to stably form the concavo-convex shape having a narrower pitch.

The conventional forming method of a micro lens will next be explained.

The micro lens is arranged as a solid state image pickup element every pixel, and is used to raise sensitivity by effectively converging light incident to each pixel to a light receiving element.

The conventional forming method of the micro lens will be explained in accordance with the processes of FIGS. 15(1) to 15(4).

A lens material film 13 is deposited on a flattened film 12 formed on a passivation film 11 of the solid state image pickup element. Thereafter, a resist film 14 is deposited on the entire surface (FIG. 15(1)). Subsequently, the resist film 14 is exposed and developed so that a separate independent pattern is formed every pixel. Concretely, patterning is performed such that each resist film 14 is located on a light receiving element 15 (FIG. 15(2)). Next, the resist film 14 is shaped in a convex curved surface shape (convex lens) by heating-melting processing (reflow) (FIG. 15(3)). Further, a micro lens 16 is formed by etching-back the resist film 14 and the lens material film 13 by the mixing gas of oxygen and a gas having a deposition property, and transferring the above convex curved surface shape to the lens material film 13 (FIG. 15(4)).

The other reference numerals and signs shown in FIG. 15 will be explained. Reference numerals 15, 17, 18 and 19 respectively designate a light receiving element, a semiconductor substrate, a vertical transfer electrode constructed by polycrystal silicon, and a light interrupting film constructed by aluminum.

In the above conventional forming method of the micro lens, the resist is shaped by heating and melting the resist to form the resist in the lens shape. However, the lens shape able to be formed is limited by only heating temperature and heating time, and it is difficult to control the fine convexo-concave portion of the curved surface shape.

In consideration of the above problems of the prior art, an object of the present invention is to provide an exposure controlling photomask and a production method thereof in which a light interrupting film on the exposure controlling photomask can be formed in the convexo-concave portion of a smoother curved surface shape in noncontact, and the pitch between top portions of a convex portion can be set to a narrower pitch.

Another object of the present invention is to provide a forming method for once transferring the lens shape to the resist by using the above exposure controlling photomask, and next etching-back a foundation material together with this resist, and transferring the lens shape to the foundation material.

Another object of the present invention is to provide a lens formed by irradiating light controlled in the exposure amount to photo-setting resin by using the above exposure controlling photomask, and its forming method.

DISCLOSURE OF THE INVENTION

In the present invention, the section of a light interrupting film 2 on an exposure controlling photomask is formed in a slanting face shape as shown in FIGS. 1 and 2. Namely, in an electron beam drawing device, a resist is coated on a photomask substrate 3 depositing the light interrupting film thereon, and irradiation is performed by changing the irradiating amount of an electron beam every place of the resist. Thereafter, development is performed so that the resist 6 is formed in a three-dimensional face structure according to the electron beam irradiating amount. Thereafter, in an etching process, the three-dimensional face structure formed in the resist is transferred and etched in a foundation material, and the foundation material is formed in the three-dimensional face structure.

In the present invention, the above three-dimensional face structure is not limited to the slanting face shape shown in FIGS. 1 and 2, but also includes the convexo-concave portion of a curved surface shape constructed by a concave curved surface and a convex curved surface. The control of the above electron beam irradiating amount can be realized by changing irradiation strength of the electron beam, or constantly setting the irradiation strength and changing the number of irradiation times and irradiation time. In the following illustrated explanation, the formation of the convexo-concave portion of the curved surface shape among the three-dimensional face structure will be explained to easily understand the invention.

FIG. 1 shows the section of an exposure controlling photomask (A) made by the above-mentioned method, and is a typical view showing incident light 1 and the light and darkness 4 of light after this light passes through this exposure controlling photomask. Here, reference numerals 2 and 3 respectively designate a light interrupting film and a glass substrate.

FIG. 2 shows the section of an exposure controlling photomask (B) made by a method different from the above production method, and is a typical view showing incident light and the light and darkness of light after the transmission. In this method, for example, a resist is laminated after a material 5 such as transparent organic resin, an oxide, etc. is deposited on the glass substrate 3. Thereafter, the resist is formed in the convexo-concave portion of a curved surface shape by the above electron beam photolithography, and the transparent material 5 as a foundation is further formed in the convexo-concave portion of the curved surface shape by transfer etching. Next, the light interrupting film material 2 is deposited on the entire surface. Thereafter, the photomask is formed by a method such as entire surface etching or polishing, etc. so as to have a suitable thickness.

The convexo-concave portion of the curved surface shape is formed in the light interrupting film in the exposure controlling photomask (A) in FIG. 1, but the convexo-concave portion of the curved surface shape is formed in the transparent material in the exposure controlling photomask (B) in FIG. 2. There are some methods as the method for depositing the light interrupting film. If the material of the light interrupting film is an organic material, there are coating and CVD methods, etc. If the material of the light interrupting film is a metal such as chromium, etc., there are evaporation, sputtering and plating methods. When the metal such as chromium, etc. is deposited by an electrolytic plating method as one kind of the plating method, close plating can be performed when an electrically conductive metal for transmitting light therethrough, e.g., a transparent electrically conductive metal such as ITO (indium-tin oxide), etc. is deposited on a glass substrate in advance.

Next, similar to the exposure controlling photomask in FIG. 2, a transparent insulator material 5 is formed in a face shape on the above electrically conductive metal. Thereafter, the metal is deposited by performing the electrolytic plating. In the electrolytic plating, the strength of an electric field is different and a plating growth speed is changed in accordance with the distance from an electrode (ITO). The plating growth speed is fast in a place near the electrode (ITO), i.e., a place in which the insulator material is thin. The plating growth speed is slow in a place far from the electrode (ITO), i.e., a place in which the insulator material is thick. The light interrupting film of a uniform thickness can be formed by controlling the voltage and the electric current such that the plating thickness becomes a suitable thickness.

If the exposure controlling photomask in the present invention is used, the convexo-concave portion of the curved surface shape can be formed by directly drawing an electron beam in photo-setting type resin so that the drawing process in the above resist can be omitted.

In the method for forming a lens by using the exposure controlling photomask in the present invention, the resist film coated on the substrate is exposed by changing the exposure light amount every place by an exposure amount control exposure method so that the film thickness of the resist after the development is controlled. Thus, the resist is shaped in a lens shape as the convexo-concave portion of the curved surface shape.

In the method for forming the lens by using the exposure controlling photomask in the present invention, the photo-setting resin is formed in the lens shape by exposing the photo-setting resin deposited on the transparent substrate from the transparent substrate side or the upper face.

BEST MODE FOR CARRYING OUT THE INVENTION

Figure 1:
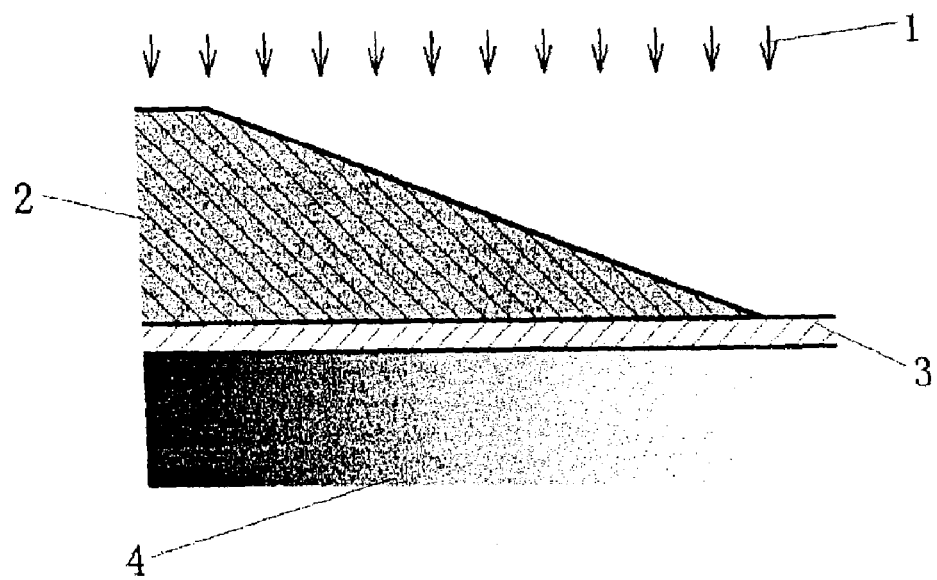
FIG. 1 is a view showing the relation of incident light, an exposure controlling photomask (A), and transmitted light.
Figure 2:
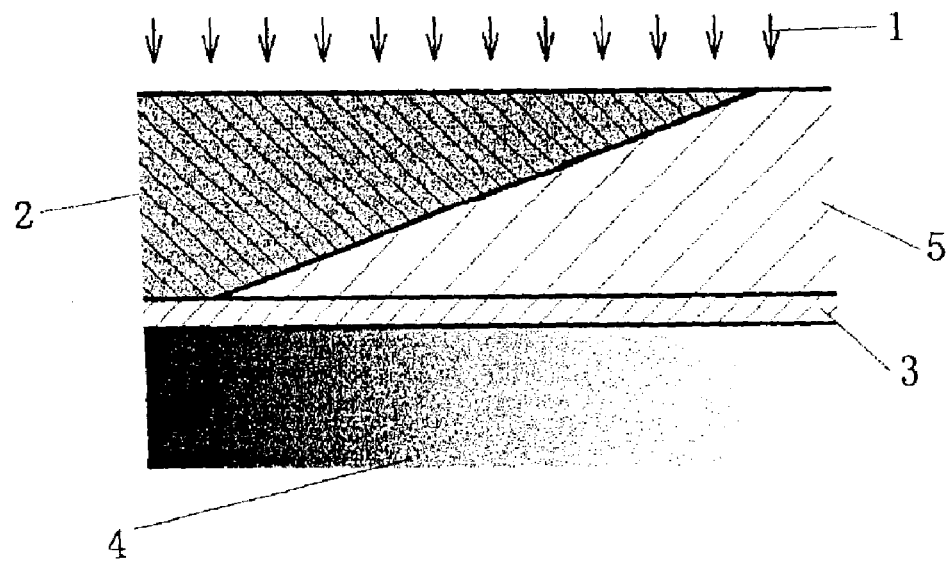
FIG. 2 is a view showing the relation of the incident light, an exposure controlling photomask (B), and the transmitted light.

The embodiments of the present invention will next be described in more detail in accordance with the accompanying drawings. FIG. 1 shows a sectional view of the exposure controlling photomask (A), and FIG. 2 shows a sectional view of the exposure controlling photomask (B).

Both the photomasks have the same performance for controlling the transmitted light amount, but their production methods are different in accordance with the material of a light interrupting film. When the etching ratios of the light interrupting film and the resist are comparatively equal, the exposure controlling photomask (A) in FIG. 1 can be made. However, when the etching ratios are greatly different, it is difficult to make the exposure controlling photomask (A). At this time, a third film having an etching ratio close to the value of the etching ratio of each of the light interrupting film and the resist between the light interrupting film and the resist is arranged and sequentially etched back, and can be also transferred and formed in a foundation material. In accordance with necessity, fourth and fifth films may be also added. However, when another film is arranged between the light interrupting film and the resist, the etch-back process is increased and processing accuracy is reduced. Therefore, it is preferable to make the exposure controlling photomask (B) in FIG. 2 having the same performance as the exposure controlling photomask (A).

The exposure controlling photomask (A) in a structure having the light interrupting film formed on a glass substrate will first be explained.

(Embodiment 1)

Figure 3:
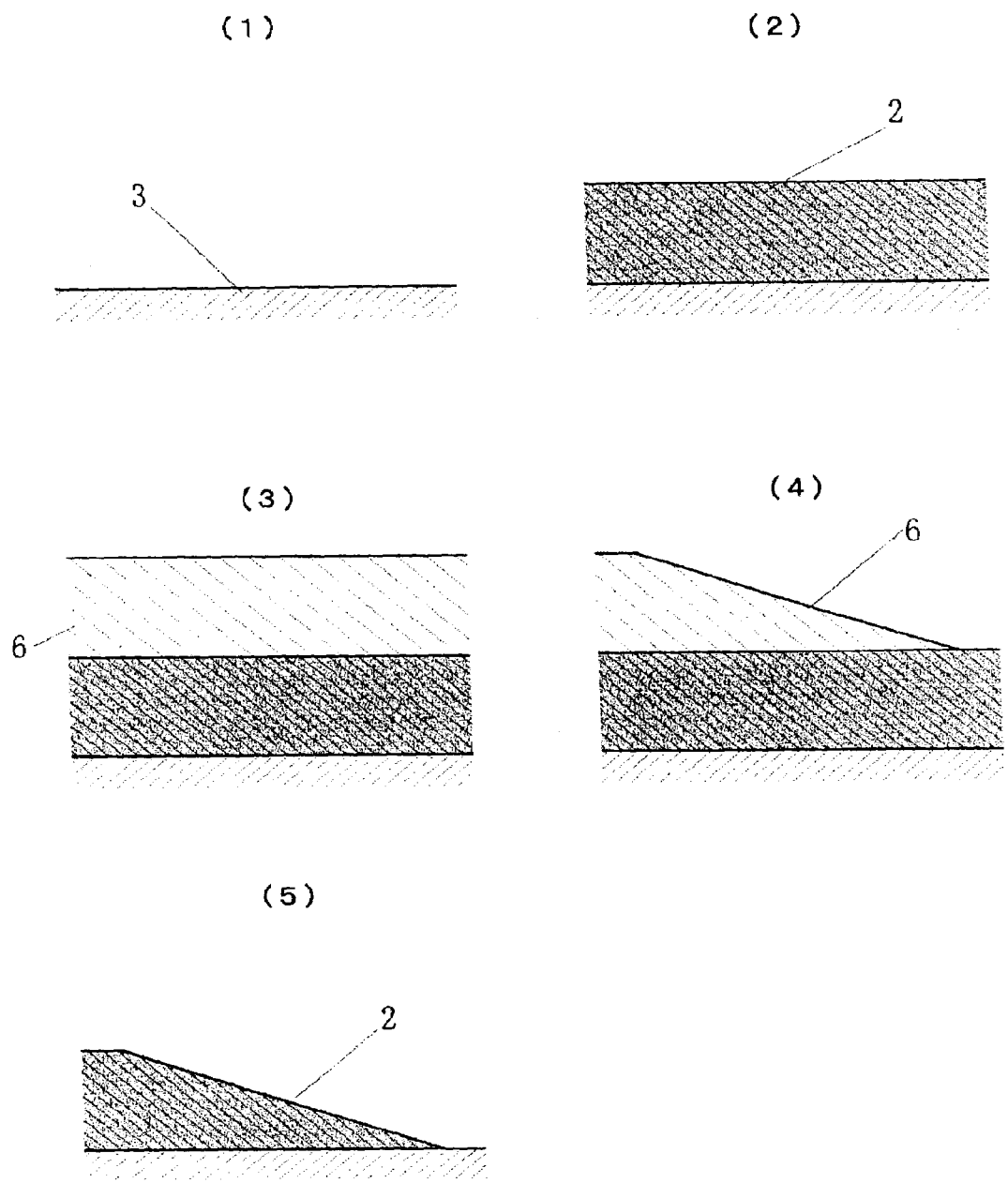
FIG. 3 is a view of a process for making the exposure controlling photomask (A).

The embodiment 1 relates to the exposure controlling photomask (A) shown in FIG. 1 and the production method thereof. FIGS. 3(1) to 3(5) are explanatory views of the production process of the exposure controlling photomask (A) in the embodiment 1.

A light interrupting film 2 is deposited (FIG. 3(2)) on a mask substrate 3 shown in FIG. 3(1), and a resist 6 is further deposited (FIG. 3(3)). Irradiation strength is changed every place with respect to this resist 6, or the irradiation strength is constantly set and the number of irradiation times and irradiation time are changed. Thus, the irradiation is performed by controlling the irradiating amount, and development is then performed so that the resist 6 is formed in the convexo-concave portion of a curved surface shape (FIG. 3(4)). Next, the etching ratios of the above resist 6 and the foundation material (light interrupting film) are set to the same, and the etch-back is performed, and the shape of the convexo-concave portion of the curved surface shape in the resist 6 is transferred to the light interrupting film 2 of the foundation (FIG. 3(5)).

Here, the transfer etching is performed in a condition in which the film thicknesses of the resist and the foundation material are set to be equal and each etching speed is the same. However, the condition of the same film thickness and the same etching speed may not be necessarily set. It is sufficient if it is a condition able to finally form the convexo-concave portion of a predetermined desirable curved surface shape in the foundation material.

(Embodiment 2)

In the embodiment 2, the exposure controlling photomask (B) shown in FIG. 2 and the production method thereof will be explained.

A transparent material 5 such as an oxide film, etc. is deposited on a mask substrate 3. A resist is next deposited. Irradiation strength is changed every place with respect to the resist, or the irradiation strength is constantly set and the number of irradiation times and irradiation time are changed. Thus, the irradiation is performed by controlling the irradiating amount, and development is then performed so that the thickness of the resist is formed in the convexo-concave portion of a curved surface shape. The etching ratios of the above resist and a foundation insulator material are set to the same, and the etch-back is performed, and the shape of the resist is transferred to the foundation insulator material 5. After a light interrupting film 2 is deposited on the above insulator material, the entire surface of the light interrupting film 2 is etched or polished until a predetermined desirable film thickness.

In the above embodiment, the process for depositing the transparent material such as an oxide film, etc. on the mask substrate can be also omitted by forming the mask substrate itself in the convexo-concave portion of the curved surface shape. There are soda glass and quartz glass in the material of the mask substrate. In the material of the light interrupting film, there are a metal such as chromium, etc., a metallic oxide film such as a chromium oxide, etc., and resin (light absorption resin) in which a light absorption material such as a dye, a pigment, etc. is dispersed. The material of the light interrupting film has a single or plural laminating layer structure of the above material. There are a sputter method, an evaporation method, a plating method, etc. in the deposition of chromium, and there are a coating method, etc. in the deposition of resin. Other mask substrate materials and light interrupting film materials according to the wavelength of light used in exposure can be also used except for the above materials.

An example in which one portion of the exposure controlling mask (B) is changed will next be explained in accordance with FIGS. 4(1) to 4(8).

Figure 4:
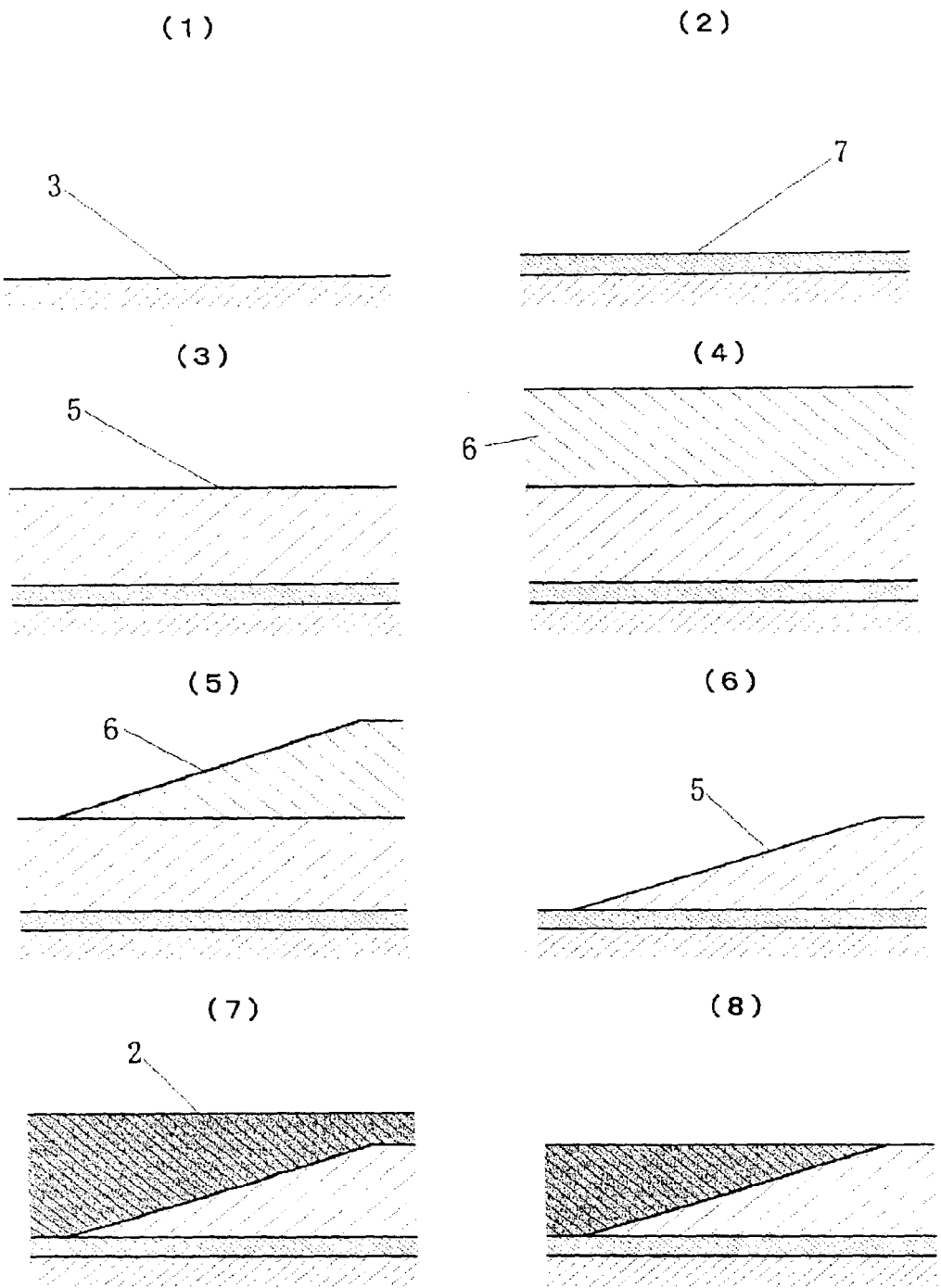
FIG. 4 is a view of a process for making the exposure controlling photomask (B) by an electrolytic plating method by using a transparent electrically conductive material in an electrode.
Figure 5:
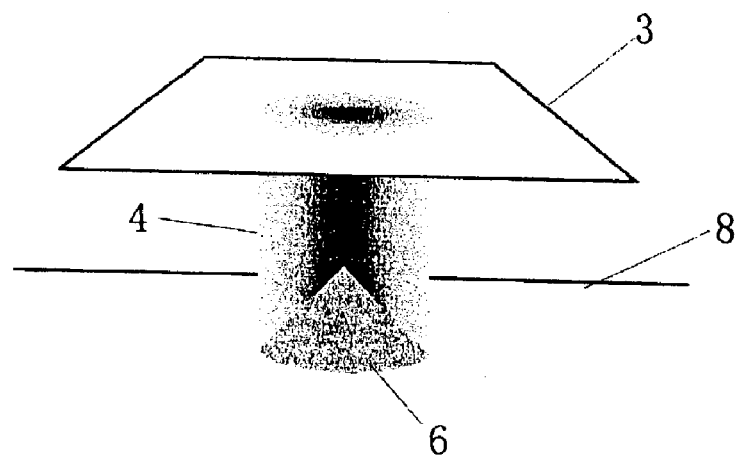
FIG. 5 is a schematic appearance view showing the relation of the exposure controlling photomask, the shape of a resist after the resist is exposed and developed by this mask, and light and darkness of the transmitted light.
Figure 6:
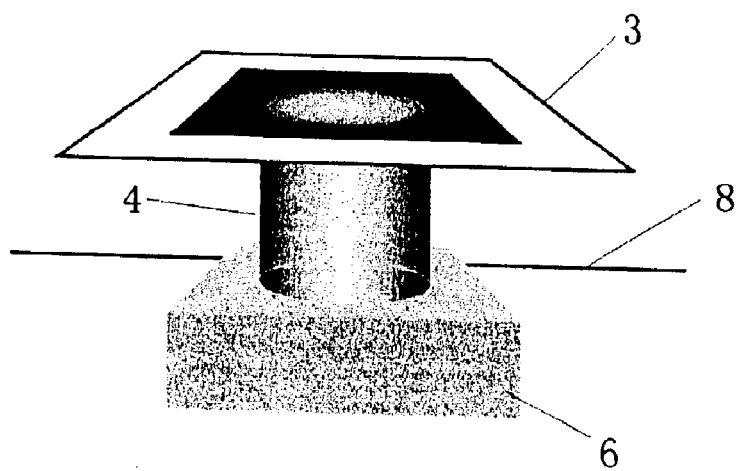
FIG. 6 is a schematic appearance view showing the relation of the exposure controlling photomask, the shape of the resist after the resist is exposed and developed by this mask, and the light and darkness of the transmitted light.

FIG. 4 is an explanatory view of a process for making the exposure controlling photomask (B) in which the shape of a curved surface is made by executing the electrolytic plating method using a transparent electrically conductive material such as ITO, etc. as an electrode. A transparent electrically conductive material 7 such as ITO, etc. is deposited (FIG. 4(2)) on a mask substrate 3 shown in FIG. 4(1), and a transparent insulating film 5 such as an oxide film, etc. is then deposited (FIG. 4(3)). Further, a resist 6 is deposited (FIG. 4(4)). Irradiation is performed by changing the irradiating amount of an electron beam every place with respect to this resist 6, and development is then performed so that the thickness of the resist 6 is formed in the convexo-concave portion of a curved surface shape (FIG. 4(5)). The etching ratios of the above resist 6 and a foundation insulator material are set to the same, and etch-back is performed, and the shape of the resist 6 is transferred to the foundation insulator material (FIG. 4(6)). The transparent electrically conductive film 7 deposited in FIG. 4(2) is set to an electrode, and a metallic light interrupting film material 2 of chromium, etc. is deposited by the electrolytic plating method (FIG. 4(7)), and is etched or polished on the entire surface until a predetermined desirable film thickness (FIG. 4(8)). If the film thickness of plating growth can be sufficiently controlled by the above electrolytic plating method, the above entire surface etching or polishing process can be omitted.

The production method of the exposure controlling photomask (B) in FIG. 2 by changing one portion of the process of the above embodiment 2, i.e., without using the electrolytic plating will be explained.

A transparent insulating film 5 such as an oxide film, etc. is deposited on a mask substrate 3. Next, a resist 6 is deposited. Irradiation is performed by changing the irradiating amount of an electron beam every place with respect to the resist 6, and development is then performed so that the resist 6 is formed in the convexo-concave portion of a curved surface shape. The etching ratios of the resist 6 and a foundation insulator material are set to the same, and etch-back is performed, and the shape of the resist 6 is transferred and etched in the foundation insulator material 5 so that the convexo-concave portion of the curved surface shape is formed. Next, the material of a light interrupting film is deposited. Thereafter, the entire surface of the light interrupting film is etched or polished until a predetermined desirable film thickness so that the photomask is completed.

In the production method in which the process of the embodiment (2) is partially changed, when photo-setting resin is used instead of the oxide film in the transparent insulating film, the convexo-concave portion of the curved surface shape can be directly formed in the photo-setting resin by the exposure of the electron beam. Accordingly, it is possible to omit the drawing process to the resist and the transfer etching process. Further, the convexo-concave portion of the curved surface shape can be also directly formed in the light interrupting film by using a laser and an ion beam. There is also a method for adjusting concentration by implanting an element as the material of the light interrupting film into the substrate by utilizing the beam.

In the embodiment mode of the present invention, the exposure controlling photomask is not only applied to a projection exposure device, but is also applied to the photomask of a reflection type exposure device. Namely, in this photomask, the light interrupting film on a reflection type mirror mask substrate is formed in the convexo-concave portion of the curved surface shape, and the amount of reflected light is controlled in proportion to the film thickness of the light interrupting film. Further, there are an ultraviolet ray, a near ultraviolet ray, an X-ray, a soft X-ray, etc. in the kind of light used in the exposure device.

The production of a lens using the exposure controlling photomask in the present invention will next be explained.

At the forming time of a micro lens, a resist film is formed on a lens material film, and this resist film is exposed by an exposure amount control exposure method and is developed so that the resist is shaped in a lens shape. In this shaping, there are a method for directly forming the lens shape by setting a foundation material to the lens material film, and a method for indirectly forming the lens shape by using the foundation material in a die frame and depositing the lens material film on this foundation material. The above exposure amount control exposure method is a method for controlling the film thickness of the resist after the development by changing the exposure amount to the resist every place in the exposure device using the mask.

It is also possible to use photo-setting type resin instead of the resist or the lens material film. Namely, when the photo-setting type resin is used instead of the resist, the photo-setting type resin can be formed in the lens shape by only directly irradiating light controlled in the exposure amount. When the photo-setting type resin is used instead of the lens material film, the photo-setting resin within the lens die frame is formed in the lens shape e.g., by filling the die frame of the lens shape with the photo-setting resin and then irradiating light to the entire surface.

The forming method of a micro lens of the present invention will next be explained in detail in accordance with the embodiments shown in the drawings.

CONCRETE EXAMPLE 1

Figure 7:
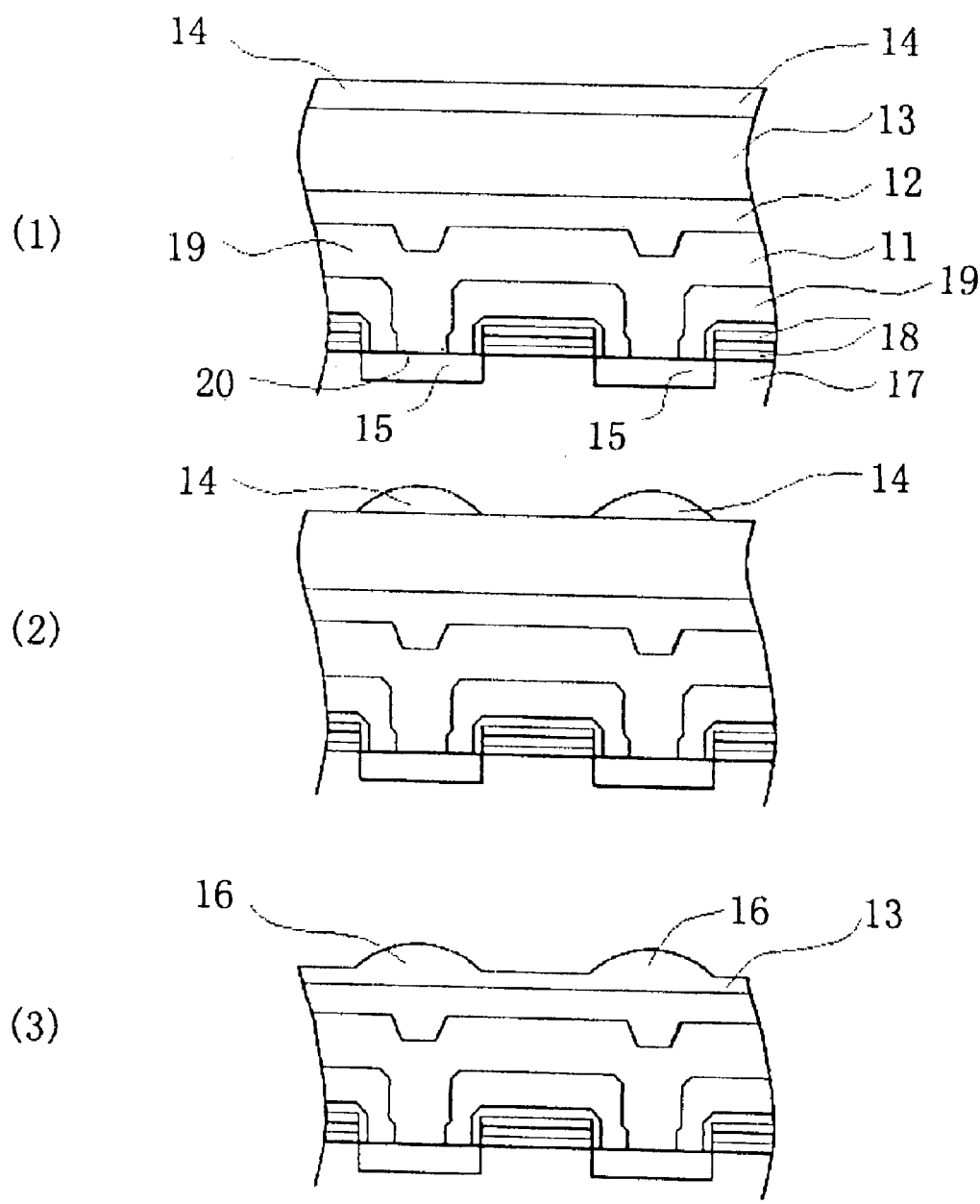
FIG. 7 is a sectional view showing the forming method of a micro lens using the exposure controlling photomask in the present invention in a process order.

FIGS. 7(1) to 7(3) are sectional views showing one example of the forming method of the micro lens in the present invention in a process order.

A lens material film 13 is formed on a flattened film 12 formed on a passivation film 11 of a solid state image pickup element. Thereafter, the resist film 14 is formed on the entire surface (FIG. 7(1)). The resist film 14 is patterned so as to be separated and independent every pixel by exposing and developing the resist film 14 by the exposure amount control exposure method, and the shape of each pixel is formed in a convex lens shape (FIG. 7(2)). Thereafter, a micro lens 16 is formed by etching-back the resist film 14 and the lens material film 13 by the mixing gas of oxygen and a gas having a depositing property, and transferring the above convex lens shape to the lens material film 13.

Reference numerals 17, 18, 19 and 20 respectively designate a semiconductor substrate, a vertical transfer electrode constructed by polycrystal silicon, a light interrupting film constructed by aluminum, and an opening.

Figure 8:
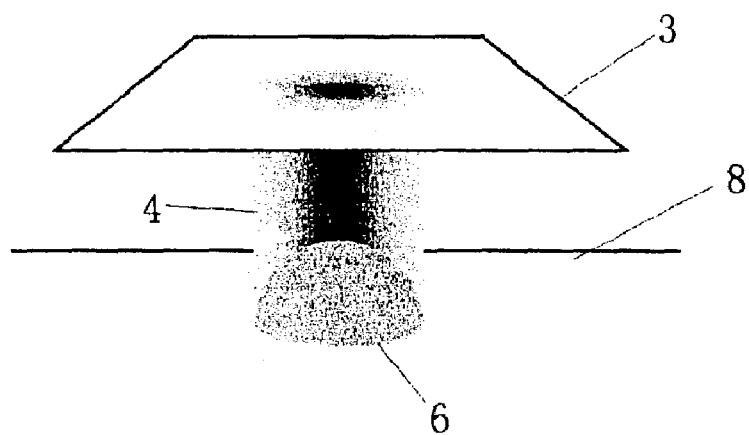
FIG. 8 is a schematic appearance view showing the relation of the exposure controlling photomask, and the shape of a convex lens of the resist after the development.
Figure 9:
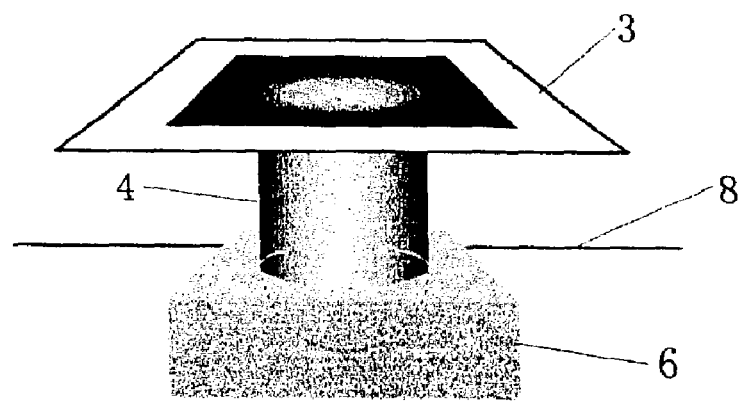
FIG. 9 is a schematic appearance view showing the relation of the exposure controlling photomask, and the shape of a concave lens of the resist after the development.

FIG. 8 is a schematic appearance view showing the relation of the resist of the convex lens shape and the exposure controlling photomask after the resist is exposed and developed by the photomask for convex lens exposure amount control to form a convex micro lens. FIG. 9 is a schematic appearance view showing the relation of the resist of a concave lens shape and the exposure controlling photomask after the resist is exposed and developed by the exposure controlling photomask for concave lens to form a concave micro lens.

CONCRETE EXAMPLE 2

Figure 10:
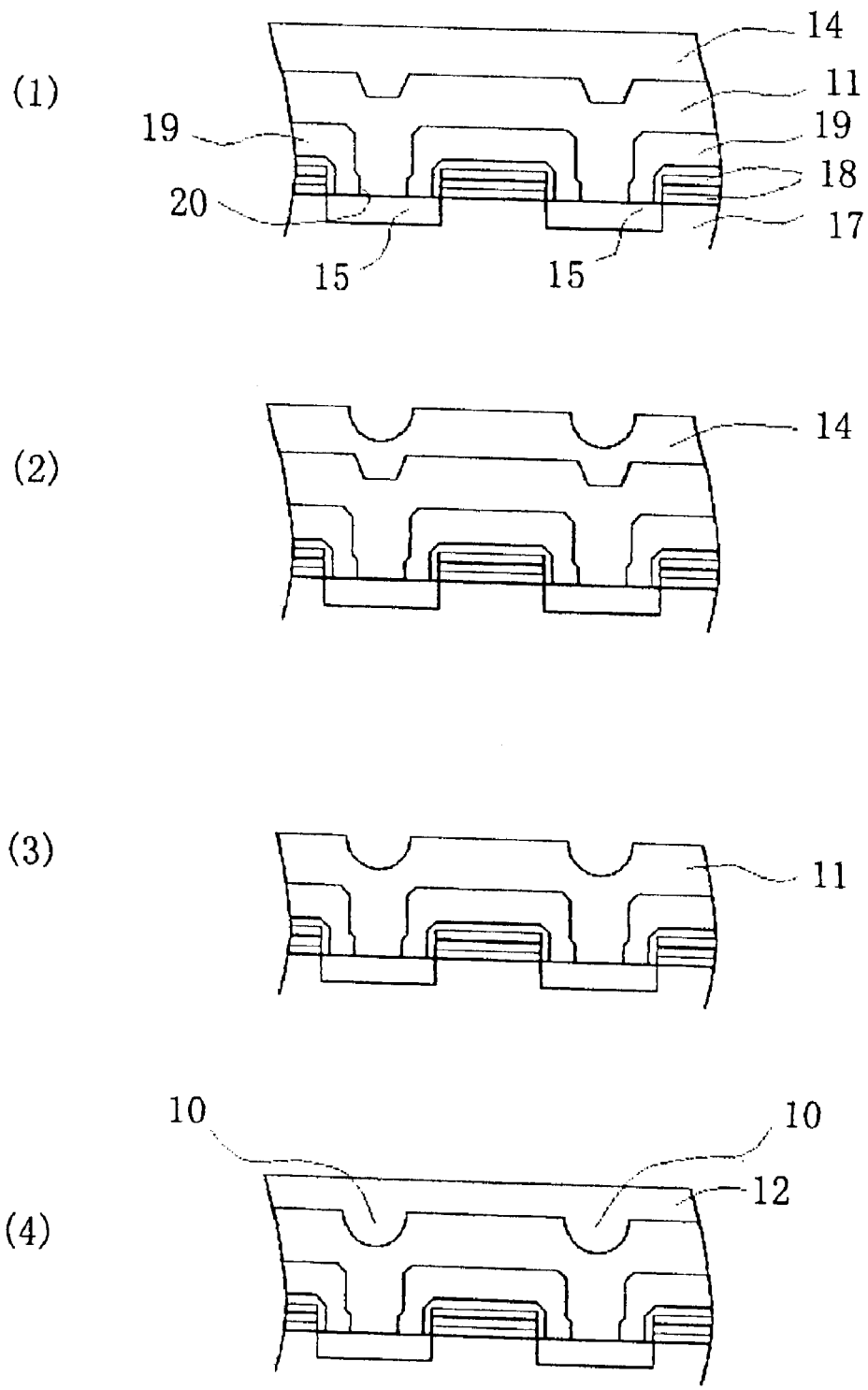
FIG. 10 is a sectional view showing the process order of the forming method of an intraformational lens using the exposure controlling photomask in the present invention.

The forming method of an intraformational lens will next be explained in detail in accordance with the embodiments shown in the drawings. FIGS. 10(1) to 10(4) are sectional views showing one example of the forming method of the intraformational lens in a process order.

The resist 14 is formed on the entire surface of a passivation film 11 of a solid state image pickup element (FIG. 10(1)). The shape of the patterned resist is formed in a concave lens shape by exposing and developing the resist film 14 by using the exposure amount control exposure method (FIG. 10(2)). Thereafter, the above concave curved surface shape is transferred to the passivation film 11 by etching-back the resist film 14 and the passivation film 11 by the mixing gas of oxygen and a gas having a depositing property (FIG. 10(3)). An intraformational lens 11 is finally completed by depositing a lens material film (here a flattened film) (FIG. 10(4)).

In this example, as shown in FIG. 10(4), the passivation film 11 is formed in the concave lens shape, but it may not be necessarily the passivation film 11. Namely, the flattened film on this passivation film 11 may be shaped in the lens shape, and a material as the lens material film may be further deposited on this flattened film and the lens shape may be also formed in this material. In this figure, the convex lens as the upper micro lens and the concave lens as the lower intraformational lens are separately formed, but the upper and lower lenses can be also connected and formed as a biconvex lens.

Further, the lens shape can be also directly formed by using photo-setting resin instead of the resist. Namely, the photo-setting resin of the convex lens shape and the concave lens shape can be hardened and shaped on the glass substrate by depositing the photo-setting resin to a transparent substrate such as a glass substrate, a plastic substrate, etc., and exposing the photo-setting resin from the glass substrate side or the upper portion by the exposure controlling exposure method.

Figure 11:
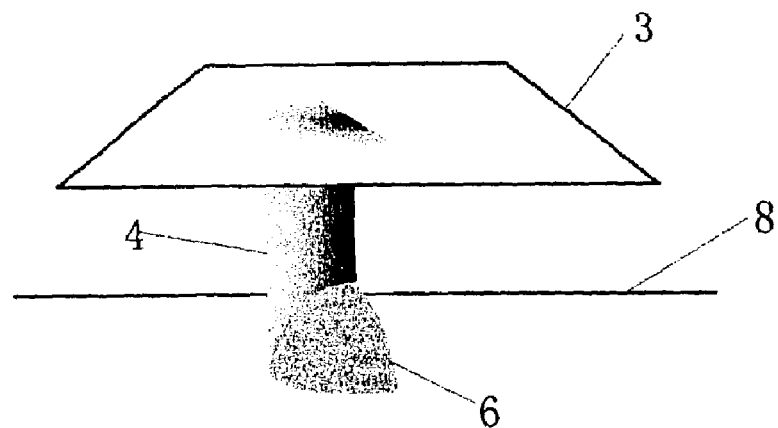
FIG. 11 is a schematic appearance view showing the relation of the exposure controlling photomask and the shape of the resist after the development, for forming the upper half of a lens having a horizontal optical axis with respect to a substrate face.
Figure 12:
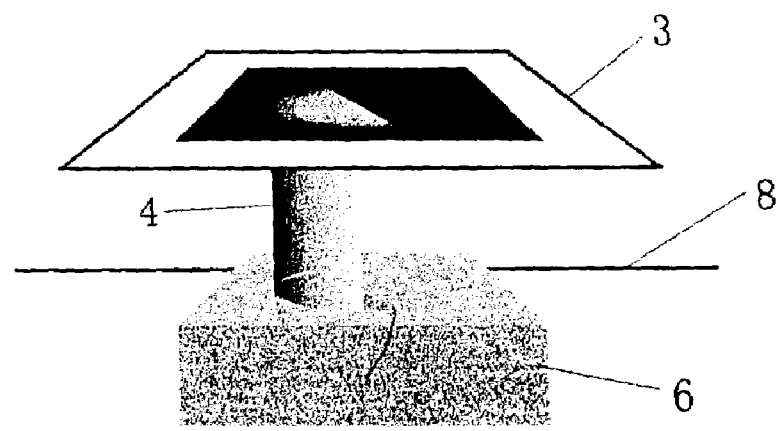
FIG. 12 is a schematic appearance view showing the relation of the exposure controlling photomask and the shape of the resist after the development, for forming the lower half of the lens having the horizontal optical axis with respect to the substrate face.
Figure 13:
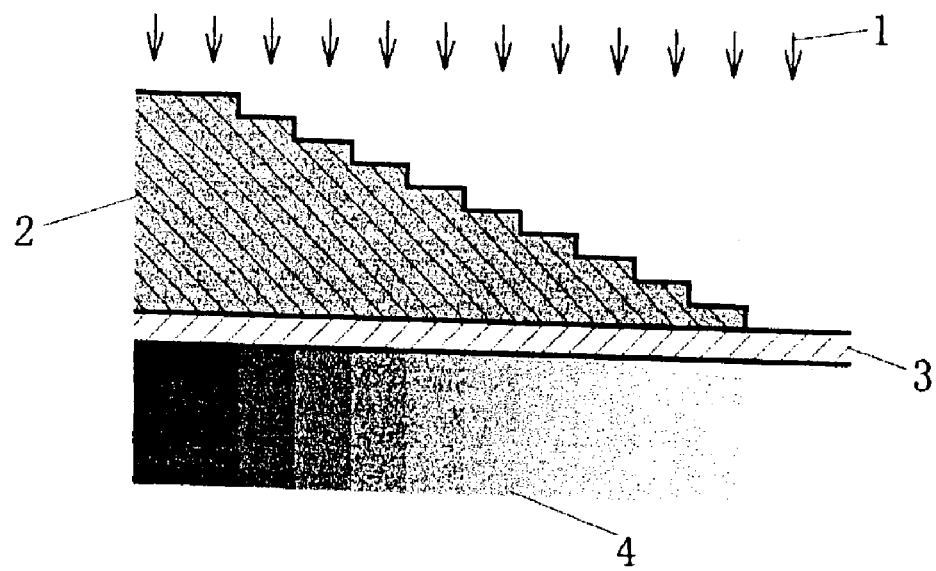
FIG. 13 is a view showing the relation of incident light and transmitted light in a conventional stepwise type mask.
Figure 14:
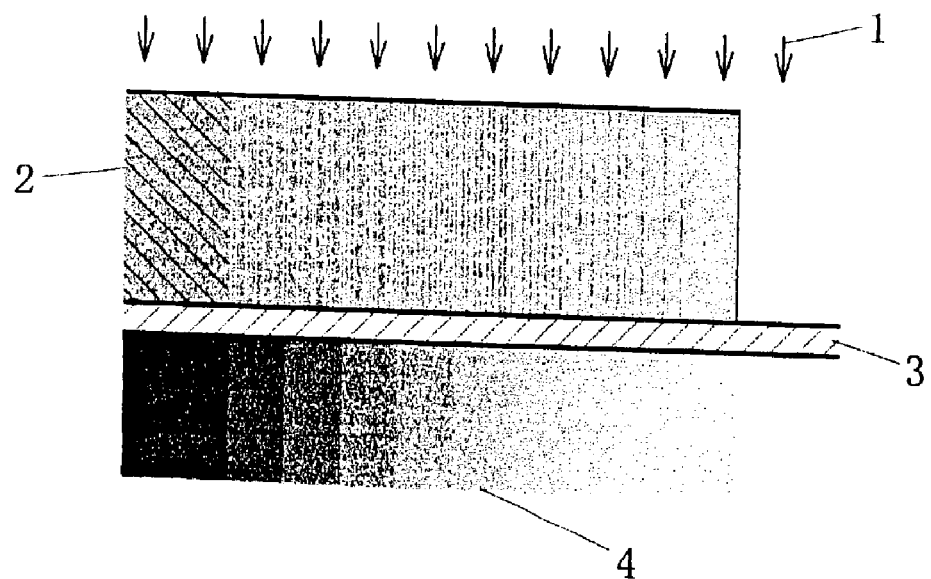
FIG. 14 is a view showing the relation of the incident light and the transmitted light in a conventional dot pattern (or hole) type mask.
Figure 15:
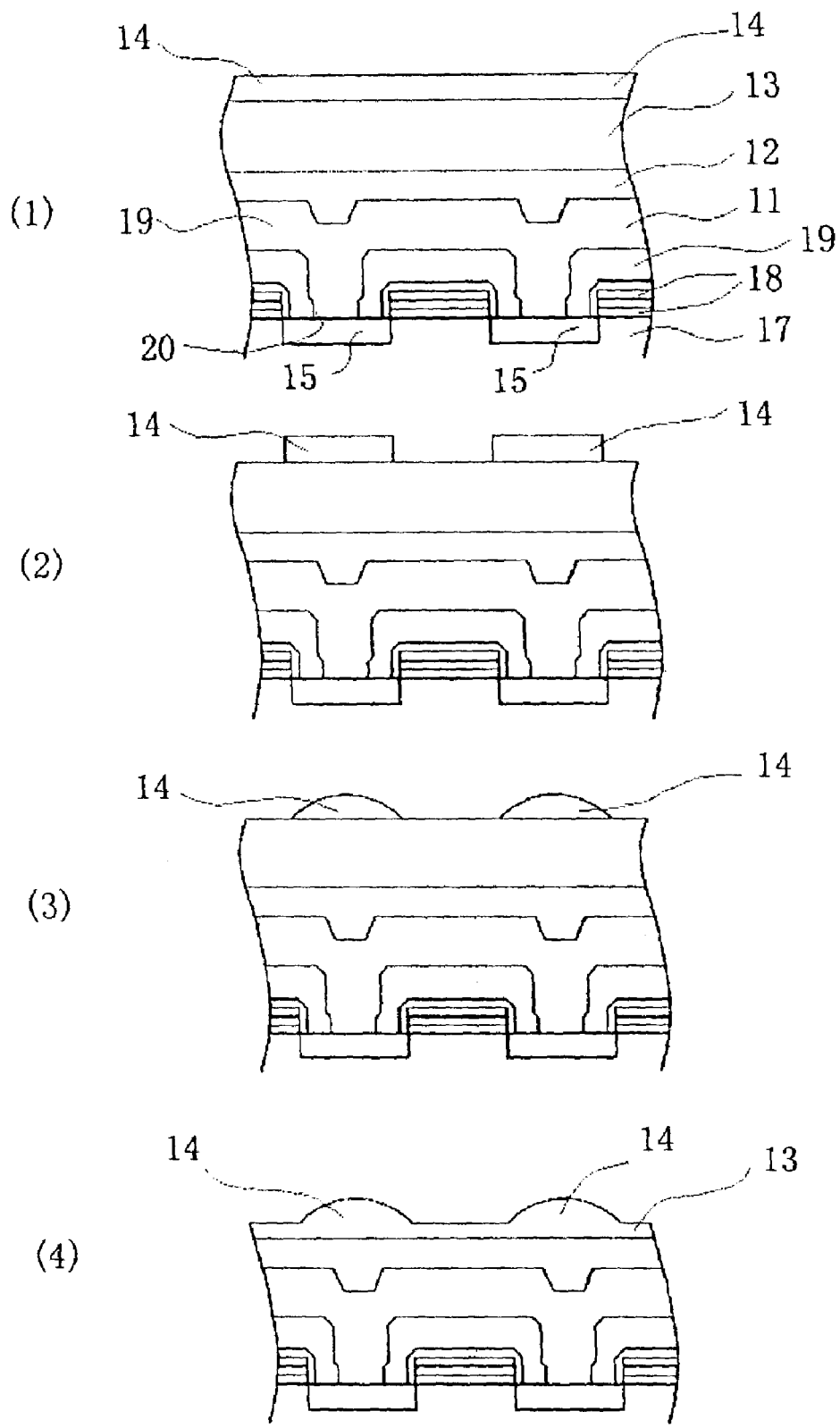
FIG. 15 is a sectional view showing the conventional forming method of a micro lens in a process order.

FIGS. 11 and 12 are schematic appearance views showing the exposure controlling photomask for forming a lens having a horizontal optical axis with respect to a substrate face, and the resist shape after the resist is exposed and developed by using this mask.

One planoconvex lens having a horizontal optical axis with respect to the substrate face can be formed if the lens is formed by the forming method of the micro lens of FIG. 7 and the intraformational lens of FIG. 10 and is vertically laminated by using the above exposure controlling photomask. In addition to this, it is possible to form lenses of various shapes such as a biconvex lens, a biconcave lens, a convex meniscus lens, a concave meniscus lens, an aspherical lens, a Fresnel lens, a diffraction grating, etc. It is also possible to form a lens in which the optical axis has an arbitrary angle with respect to the substrate face. Namely, the die frame of the shape of a portion as the lower face of the lens is first formed, and the lens material is next deposited, and the shape of a portion as the upper face of the lens is further formed so that the lens is completed.

INDUSTRIAL APPLICABILITY

As mentioned above, the cubic shape of a compacter and close three-dimensional face structure can be formed by using the exposure controlling photomask in the present invention. Accordingly, it is possible to produce super precise parts such as a micro coil, a micro gear, a micro machine, etc.

It is also possible to produce parts of a micro lens, a reflection type liquid crystal display device, an optical integrated circuit, etc. For example, the lens of a shape unable to be formed in the conventional heating-melting method (e.g., lenses having optical axes horizontal and inclined with respect to the substrate face) and a lens compact in size can be formed with high accuracy by using the exposure controlling photomask in the present invention in the production of the micro lens. Further, the heating-melting process can be omitted.

The invention claimed is:

1. A production method of an exposure controlling photomask, the production method comprising:
   depositing a transparent material on a mask substrate to form a transparent material film as a transparent foundation material;
   depositing a resist on said transparent material film;
   continuously variably irradiating said resist with an electron beam by continuously varying an irradiating amount of the electron beam by varying at least one of intensity and douation while irradiating said resist to produce an exposure depth so as to define a three-dimensional face structure to be developed from the resist as a remainder wherein the remainder continuously varies between 100% and 0% of a thickness of the resist;
   performing development of the resist to produce the three-dimensional face structure according to said electron beam irradiating amount;
   etching-back said resist and the transparent material film so as to transfer the three-dimensional face structure of said resist to the transparent material film; and
   depositing a light interrupting film in a concavity of said three-dimensional face structure of said transparent material film such that a contour thickness of the light interrupting film varies inversely with a corresponding contour thickness of the transparent material film defined by the three-dimensional face structure.

2. A production method of an exposure controlling photomask, the production method comprising:
   depositing an electrically conductive transparent material on a mask substrate to form an electrically conductive transparent film on the mask substrate;
   depositing an insulating transparent material on the electrically conductive transparent film to form an insulating transparent material film;
   depositing a resist on said insulating transparent material film;
   continuously variably irradiating said resist with an electron beam by continuously varying an irradiating amount of the electron beam by varying at least one of intensity and duration while irradiating said resist to produce an exposure depth so as to define a three-dimensional face structure to be developed from the resist as a remainder wherein the remainder continuously varies between 100% and 0% of a thickness of the resist;
   performing development of the resist to produce the three-dimensional face structure according to said electron beam irradiating amount;
   etching-back said resist and the insulating transparent material film so as to transfer the three-dimensional face structure of said resist to the insulating transparent material film; and
   depositing a light interrupting film, by an electrolytic plating method using said electrically conductive transparent film as an electrode, in a concavity of said insulating transparent material defined by the three-dimensional face structure such that a contour thickness of the light interrupting film varies inversely with a corresponding contour thickness of the insulating transparent material film defined by the three-dimensional face structure.

3. A production method of an exposure controlling photomask according to any one of claims 1 or 2, wherein the shape of the resist after the development is a slanting face shape.

4. A production method of an exposure controlling photomask according to any one of claims 1 or 2, wherein the shape of the resist after the development is a convexo-concave curved surface shape.

5. A production method of an exposure controlling photomask according to claim 2, wherein the insulating transparent material is photo-setting resin.

6. An exposure controlling photomask made by the production method according to any one of claims 1 or 2.

7. A patterning method of a resist wherein said resist is formed in a predetermined desirable pattern having three-dimensional curving structure by controlling an exposure amount of said resist using the exposure controlling photomask made by the production method according to any one of claims 1 or 2 in a lithography process for patterning the resist by using the exposure controlling photomask.

8. A forming method of a micro lens a resist film is coated on a flattened lens material film, and is patterned in a shape of an upper face of the lens by the patterning method of the resist according to claim 7, and is then etched back and removed such that the lens is simultaneously formed in said lens material film.

9. A forming method of a micro lens wherein a resist film is coated on a material as a flattened die frame and is patterned in a shape of a lower face of the lens by the patterning method of the resist according to claim 7, and is then etched back and removed such that the shape of the lower face of the lens is simultaneously formed as a concavity in the material as said die frame, and the lens is formed by depositing a lens material film in the concavity of said die frame.

10. A forming method of a micro lens according to claim 9, wherein the lens material film is photo-setting type resin.

11. A production method of an exposure controlling photomask according to claim 1, wherein the transparent material is photo-setting resin.

12. A production method of an exposure controlling photomask according to claim 1, wherein the step of depositing the light interrupting film forms the light interrupting film such that a contour thickness of the light interrupting film varies inversely with a corresponding contour thickness of the transparent material film defined by the three-dimensional face structure.

13. A production method of an exposure controlling photomask according to claim 12, wherein the step of depositing the light interrupting film includes forming a top surface of the light interrupting film planar with upper portions of the transparent material film defined by the three-dimensional face structure.

14. A production method of an exposure controlling photomask according to claim 2, wherein the step of depositing the light interrupting film forms the light interrupting film such that a contour thickness of the light interrupting film varies inversely with a corresponding contour thickness of the insulating transparent material film defined by the three-dimensional face structure.

* * * * *